United States Patent [19]
Van Den Heuvel

[11] Patent Number: 4,809,222
[45] Date of Patent: Feb. 28, 1989

[54] ASSOCIATIVE AND ORGANIC MEMORY CIRCUITS AND METHODS

[76] Inventor: Raymond C. Van Den Heuvel, 18618 Celtic St., Northridge, Calif. 91326

[21] Appl. No.: 876,726

[22] Filed: Jun. 20, 1986

[51] Int. Cl.[4] ...................... G11C 7/06; G11C 27/02; G11C 27/00

[52] U.S. Cl. ..................................... 365/45; 364/800; 364/807

[58] Field of Search ..................... 365/45, 49; 364/800

[56] References Cited

U.S. PATENT DOCUMENTS

| | | | |
|---|---|---|---|
| 3,395,393 | 7/1968 | Githens | 365/49 |
| 3,697,951 | 10/1972 | Bartholomew et al. | 365/49 X |
| 3,699,545 | 10/1972 | Kluge | 365/49 |
| 3,845,471 | 10/1974 | Reitbeock et al. | 365/49 X |
| 4,156,286 | 5/1979 | Connors et al. | 365/45 |
| 4,641,278 | 2/1987 | Saito | 365/49 X |
| 4,648,072 | 3/1987 | Hayes et al. | 365/45 |
| 4,660,166 | 4/1987 | Hopfield | 364/807 |
| 4,737,929 | 4/1988 | Denker | 364/807 |

OTHER PUBLICATIONS

"Neural Networks Näive, Says Minsky" Electronic Engineering Times, by R. Colin Johnson, Aug. 3, 1987.
"Neurocomputing: Picking the Human Brain" IEEE Spectrum Mar., 1988 by Robert Hecht–Nielsen.
"Data Trans Formation Explains the Basics of Neural Networks" EDN May 12, 1988 by Doug Conner.
"The Brain May Yet Meet its Match in a Computer"; Los Angeles Times, Thomas H. Maugh II Mar. 18, 1986.
"Bell Labs Builds AI Engine-On-Chip With 'Fuzzy' Logic", Electronic Engineering Times, R. Colin Johnson Dec. 16, 1985.
"Charge Coupled Devices" Scientific American, Feb. 1974 by Gilbert F. Amelio.
Fairchild Weston Schlumberger–CCD Data Spec Sheet 1986.
"Signal Processor's Multiple Memory Buses Shuttle Data Swiftly" Electronic Design Feb., 1986, pp. 147–153 by Schwartz et al.

*Primary Examiner*—Stuart N. Hecker
*Assistant Examiner*—Alyssa H. Bowler

[57] ABSTRACT

An Organic-Like Memory (OLM), i.e., one in which information already in storage is enhanced or degraded with each new access. The OLM typically consists of a conventional random access memory (RAM) embedded in an analog computer. The data D (typically a number of bits) already stored at a given address A in the RAM is modified rather than simply re-written every time a stimulus or other item of information S is entered in the OLM.

When an item of information S is to be entered in OLM at address A, the following takes place: information S is multiplied by a weight factor W, yielding a first product; information D is read from RAM address A and multiplied by a quality factor Q, yielding a second product; the two products are added, and the result stored back at address A. The source and time of sampling of S, address A, weight factor W and quality factor Q are determined by a separate control circuit, in which the appropiate program can typically be loaded. Data in RAM can also be read in a conventional way.

5 Claims, 2 Drawing Sheets

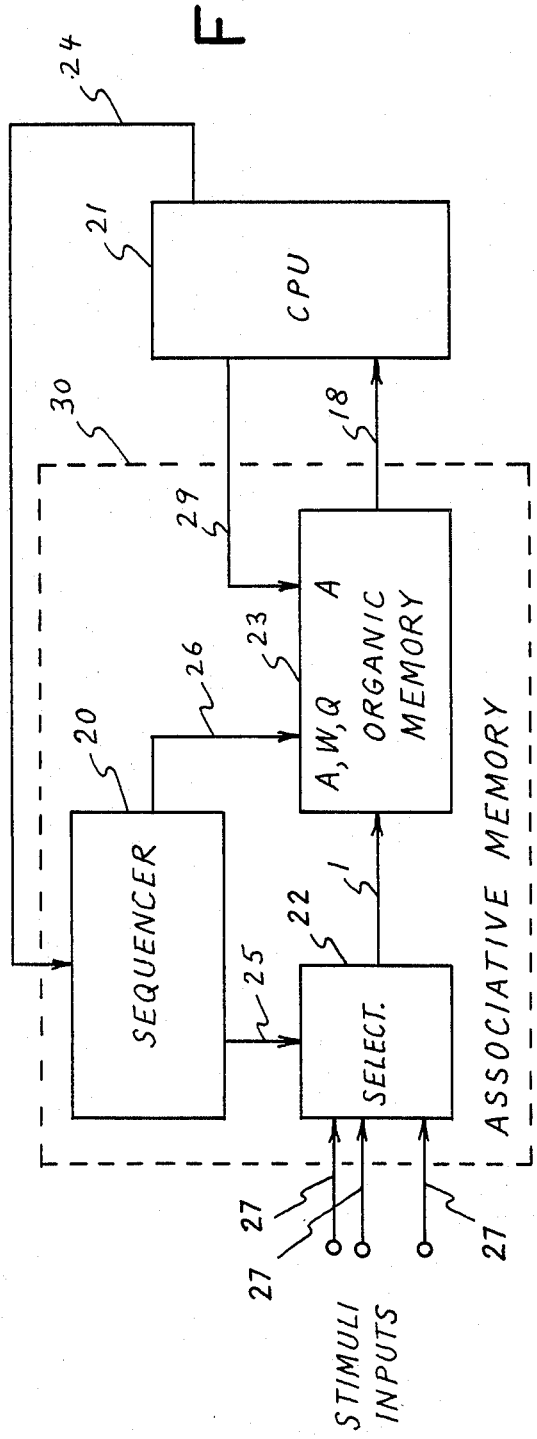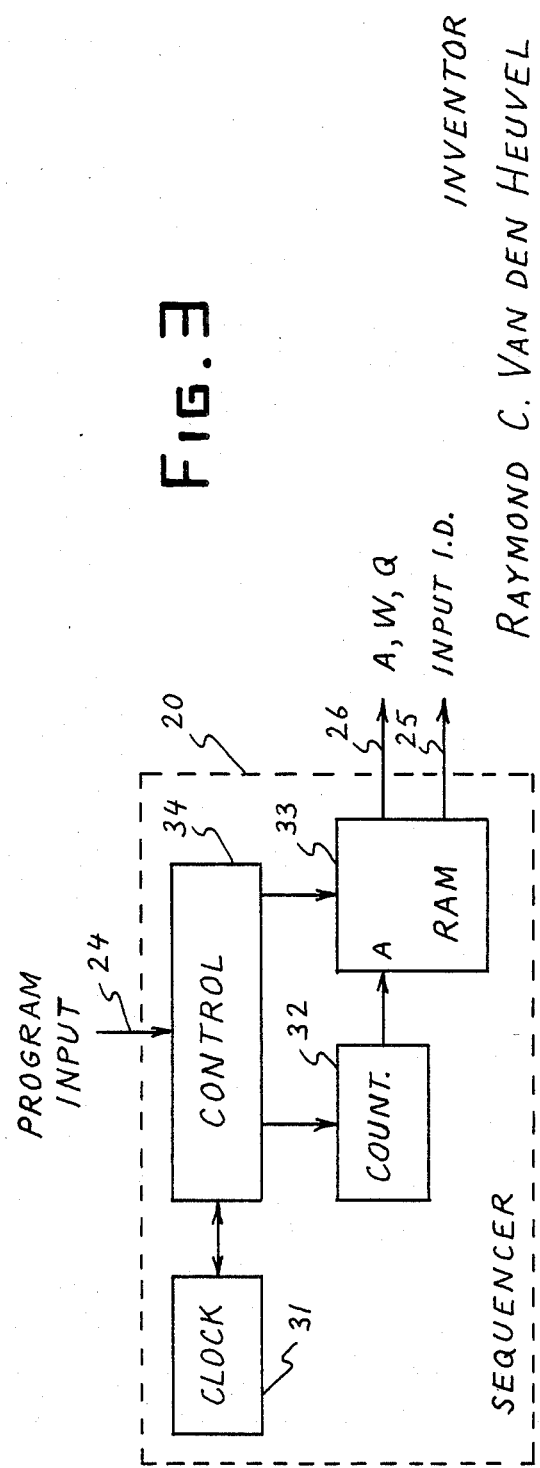

ASSOCIATIVE AND ORGANIC MEMORY CIRCUITS AND METHODS

1.0. Background of the Invention

1.1. FIELD OF THE INVENTION

The present invention relates to apparatus and methods for recognizing patterns and waveforms in the general field of Artificial Intelligence.

1.2. Description of Prior Art

The concept of associative memory is not new in computer science. It refers to a highly desirable ability that is present in living brains and allows them to recognize features and situations in the environment.

Naturally computer scientists have worked relentlessly at algorithms and hardware that imitate the way the brain works.

A typical reference to this kind of work can be found in an article published on Mar. 18, 1986, in the Los Angeles Times, on page 1, entitled "The Brain May Yet Meet its Match in a Computer." This is a good article for the layman.

As scientists are quick to point out, brains are not made of silicon, and there is no possible comparison between brain and computer hardware. "Neurons" built in silicon cannot "grow" like the organic tissue models. Yet a lot of brainpower is expended trying to devise a transistor architecture that resembles networks of neurons.

A more classical approach consists of designing a series of computers capable of the speed, memory and power required to analyze waveforms and patterns by means of the well-known Fourier Transform. The two technical references below are representative of the state of the art more generally in use.

The first technical reference is an article printed in the Dec. 16, 1985 issue of the Electronic Engineering Times on page 8 under the heading "Bell Labs Builds A.I. Engine-On-Chip With 'Fuzzy' Logic."

The second technical reference is from the Feb. 20, 1986 issue of Electronic Design Magazine, page 147, in an article entitled "Signal Processor's Multiple Memory Buses Shuttle Data Swiftly." The authors are Michael Schwartz, Juan Schiappacasse, and Graham Baskerville, all of National Semiconductor Corporation.

The cost and complexity of the foregoing methods derive from a too literal attempt to copy brain cell architecture on the one hand, and implementation of classical mathematical algorithms on the other. There is a tendency to dwell at extremes of speed, memory capacity, chip complexity and computational accuracy, depending on the specialization of the individual(s) doing the research.

2. SUMMARY OF THE INVENTION

The foregoing shortcomings and disadvantages of the prior art are addressed and overcome by the present invention which provides an improved and simplified architecture for the distribution of electrical signals indicative of "stimuli" or input functions to specific memory locations with which said "stimuli" or other input functions have a relationship or association.

In addition, the present invention allows the passage of time (real or simulated) to modify the contents of said memory locations.

Since "stimuli" or input functions are processed "on the fly," "buffer" memories and intermediary data stores can be reduced or eliminated.

The foregoing and additional features of this invention will become further apparent from the detailed description that follows. This description is accompanied by a set of drawing figures. Numerals utilized in conjunction with the drawing figures correspond to numerals in the written description. Like numerals refer to like features of the invention throughout both the written description and the drawing figures.

3. BRIEF DESCRIPTION OF THE DRAWINGS

FIG. 2 is a block diagram of a representative system showing how an associative memory can be built using an organic memory in accordance with the invention;

FIG. 3 is a block diagram of a sequencer that can be used for the control of the associative memory of FIG. 2.

4. DETAILED DESCRIPTION

Figure 1:
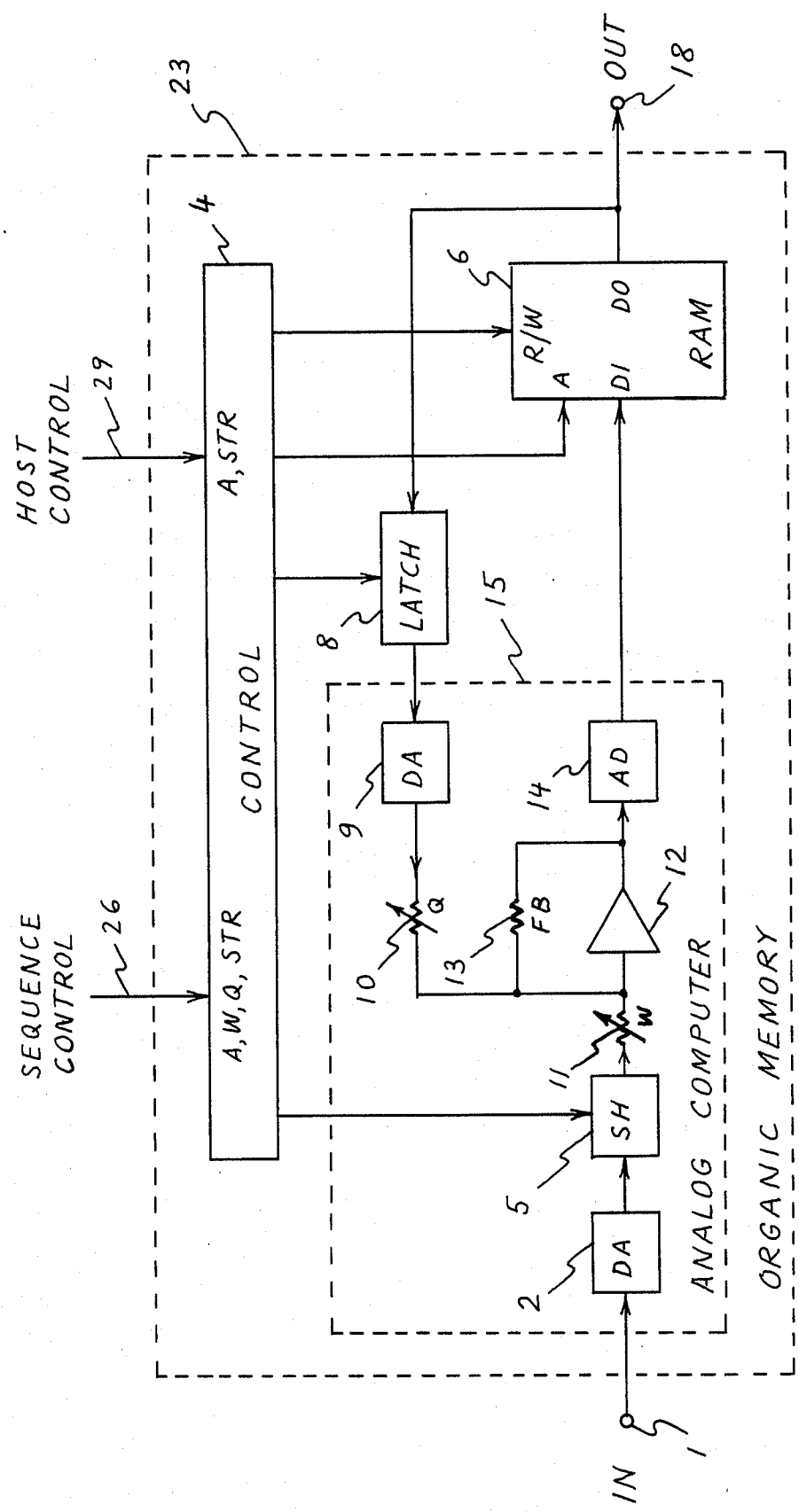
FIG. 1 is a block diagram of an organic memory in accordance with the invention.

Turning now to the drawings, FIG. 1 is a block diagram of an organic memory 23 in accordance with the invention.

Organic memory 23 includes at least a digital memory 6, means for reading out information stored in a location or origin A in memory 6, means for modifying said information and means for storing back said information after modification into said location or origin A in memory 6.

Said means for modifying information include circuit means 2, 5, 8, 9, 10, 11, 12, 13 and 14 which are used to process signals from memory 6 and organic memory input 1. Control circuit 4 generates the necessary timing and control signals.

There are two external sources of control for organic memory 23.

A first control input 26 allows a sequencer to enter timing signals and data parameters into organic memory control circuit 4.

A second control input 29 allows an external "host" circuit (typically a CPU) to read data out of any location in memory 6 without interfering with the basic sequence previously described. (Memory control 4 arbitrates conflicts between sequence control 26 and host control 29.)

In order to implement the basic organic memory sequence of events, memory control 4 requires the following signals from sequence control input 26:

1. An address A describing the location in memory 6 where the data to be modified is found;

2. A weighting factor W describing the amount or proportion of the external data referred to as organic memory input 1 that is to be added (algebraically) to the quantity to be stored back at address A in memory 6;

3. A quality factor Q describing the amount or proportion of the data read out from memory 6 at address A that is to be stored back, with the addition of said amount or proportion W of the external data previously referred to, into location A of memory 6;

4. A "strobe" signal STR which becomes "true" at specified moments in time when each organic memory cycle must start.

The basic organic memory sequence referred to above includes the following succession of events:

Organic memory input 1 (from an external source) when not already in analog form, is converted into its analog equivalent voltage level in D/A converter means 2 and captured by sample and hold circuit 5 when the strobe signal from sequence control 26 is "true." At the same time that said strobe is "true" data is read out from memory 6 at address A and captured by latch 8. Data stored in latch 8 is subsequently converted to its analog voltage level in D/A converter means 9.

At this point, data to be added and modified is available in analog form for processing by analog circuit means 2, 5, 9, 10, 11, 12, 13 and 14. Said means in combination constitute an analog computer 15 capable of performing two multiplications and one addition in a very short time.

Variable gain resistor means 10 and 11 (or their equivalent circuits) multiply data from D/A converter means 9 and from Sample and Hold means 5 by factors Q and W respectively, and the combination of operational amplifier 12 and feedback resistor 13 adds the results. This result is reconverted to a digital equivalent code in A/D converter means 14.

A (relatively) short time after the strobe in sequence control 26 becomes "true", and when the output of A/D converter means 14 has had time to "settle", its value is stored in memory 6 at address A.

Thus, the information originally stored at address A has gone full circle and returned—after some changes that reflect the passing of time and the influence of "outside stimuli." These changes cause it to be reinforced or degraded. The advantages of this procedure will be explored in more detail in what follows, when it is shown that it is one of the simplest, and perhaps most "natural" methods of pattern recognition.

As previously stated, control circuit 4 can initiate a secondary sequence which will allow a CPU or other user circuit to have access to data stored in memory 6. This secondary sequence, which is a traditional "memory-read" operation, starts when a strobe signal is received via host control input 29. Upon receiving this command, control circuit 4 responds by causing the contents of memory 6 to be read at the location designated by the address portion of signal 29 and making the retrieved data available at organic memory output 18.

In short, memory 6 functions as a "dual-port" memory, i.e., it can be read from two separate and distinct "ports" by two users, and Control circuit 4 "arbitrates" when both users want access at the same time.

Memory 6 can in fact be used as an interface between a source of external data and a CPU or other device that uses the data after a recognizable pattern has started to emerge.

Now the real advantage of this invention starts to become evident. Indeed, each addressable location in memory 6 represents an "association area," i.e., each memory location corresponds to or represents a specific object or condition capable of being recognized. Whenever a signal is received from a sensor or other source that is known to "belong to" or "go with" a known object or condition, it is used to increase or decrease the number stored in the memory 6 location assigned to that object or condition. But more on that later.

FIG. 2 shows how an organic memory 23, a sequencer 20 and a selector 22 can be combined to form an associative memory 30.

Also represented on FIG. 2 is a typical user of the associative memory, in this case CPU 21.

CPU 21 has a direct connection 24 with sequencer 20 by means of which it can load into sequencer 20 a "program" or "sequence" to be followed or executed later by sequencer 20.

Sequencer 20 has a first output 25 connected to selector 22 and a second output 26 which is the sequence control input of organic memory 23 previously described.

Selector 22 is connected to sources of data ("stimuli" from sensors or memories) via inputs 27 and selects one of these sources at a time according to source identifying signal 25 from sequencer 20. Selector 22 then connects said selected source via signal line 1 to organic memory 23.

As has been mentioned previously, at any time during execution of the sequencer program the user, here CPU 21, can request the latest data update from organic memory 23 by sending a strobe and the address of the desired data in memory 6 via connection 29 to organic memory 23. Organic memory 23 responds by sending the requested data via connection 18 to CPU 21 at a later time when this does not interfere with the timing of signals from sequencer 20.

(Protocol signals, such as strobes, etc. have been omitted here in order to simplify the discussion.)

The program loaded in sequencer 20 from (CPU) user 21 is nothing more than a succession of digital words that sequencer 20 reads out one at a time at predetermined time intervals via signal lines 25 and 26. Each word represents memory addresses, W and Q parameters and connections to be made to external sources of "stimuli."

FIG. 3 shows the basic functions that must be implemented within sequencer 20.

A clock 31 is needed to keep track of time. It is used to update address counter 32.

Sequencer 20 includes as its main component a memory 33 in which is stored a program consisting of a list of "events" that must occur at exact times, in exact order or at least in rapid sequences. These "events" include the reading of data from one source or memory location and their transfer to another. The digital codes stored in one sequencer memory 33 location therefore include (but are not limited to) an address of origin and an address of destination, side by side.

In this invention, sequencer means 20 preferrably controls the sampling of real data (i.e., external to the machine) in "real time." The intent is to take advantage of "real world" sources of data in preference to the more usual data base memories.

Also, and more important, the ability to sample data in real-time leads to unique "pipelining" opportunities. Indeed, control over the time and order of each sample makes unnecessary most of the many, time-consuming mathematical operations associated with the Fast Fourier Transform and other similar or equivalent algorithms.

Counter 32 generates a sequence of successive addresses for RAM memory 33.

RAM memory 33 contains "control words" stored in successive addresses so that each new word is outputted in the correct time and sequence as counter 32 is incremented.

Each word outputted by RAM memory 33 is split into two parts. The first part is the address of the input data source and is sent to selector 22 via connection 25. the second part is a combination of organic memory address, weighting factor W and quality factor Q and is sent to organic memory 23 via connection 26.

Finally, control circuit 34 may or may not contain a microprocessor.

Consider now an example in which a word in the program of sequencer 20 is 40 bits wide. The first eight bits are used to identify a specific sensor. The next 16 bits specify the address in memory 6 where the amount stored as a digital code must be modified as a function of the output of the chosen sensor. The remaining sixteen bits carry a strobe signal and information needed by an organic memory in order to set the weight W (i.e., the importance) and quality factor Q (i.e., the retention) associated with data from the chosen sensor and the selected memory location respectively.

The eight bits that identify a sensor (or other source of data) are sent to selector 22 through signal line 25. The rest are sent to organic memory 23 via line 26.

Let us next consider a hypothetical situation where it is desired to recognize a musical tone with a pitch or frequency of 1000 cycles per second plus or minus 10 percent. The period or duration of one cycle of this tone is one millisecond and its associated "quality factor" Q is approximately 10. (A quality factor of 10 means that it will take a time duration equivalent to 10 cycles for the "memory" of the 1000 Hz tone to decay to approximately 30 percent of its original value).

If sequencer 20 is designed to change the state of the connections between sensors and organic memory 23 every one tenth of a millisecond (i.e., ten thousand times per second), and if a location M in digital memory 6 of organic memory 23 is designated as the "place" associated with the 1000 Hz tone and a microphone at external address P, then every tenth word in the sequencer program must contain a source address P, a destination address M, a weighting factor $W=0.1$ and a quality factor $Q=0.90$.

After a sufficient number of cycles, the value stored at location M will tend to be a maximum value provided, of course, that the electrical wave that represents the tone was sampled each time at or near its positive peak or crest. (In practice, more than one memory location will be provided for each frequency and source of interest, so that signals out of phase will also be represented.)

As a result of the timing of the interconnections specified by the sequencer program between microphone P and memory location M, the contributions of waves with a frequency other than 1000 cycles per second will tend to average out to a value near zero.

Actually, the above example is oversimplified. In practice, it is necessary to sample data at a rate greater than twice the maximum frequency of any signal component that is likely to be contained in the input signal. Similarly, more than one location in memory 6 needs to be associated with the same frequency.

There is a special advantage in assigning two locations (a "pair") in memory 6 for each frequency of interest. The first location of the pair can then be assigned to components that are in phase with a sine wave taken as the reference for the frequency of interest and the second location of the pair can be assigned to components that are in quadrature (i.e., whose phase differs by 90 degrees) with the reference sine wave. The first location is thus associated with what is known as the "real component," and the second with the "imaginary component" of the vector that represents a frequency of interest. Accordingly, the weighting factor W for the samples entered in each memory location pair turns out to be a cosine function for the "real" component and a sine function for the "imaginary" component.

To one familiar with the mathematics of the Fourier Transform (and in particular with its modified form, the Fast Fourier Transform or FFT) the performance of the "frequency filter" just described can be shown to be equivalent to that of a digital FIR (Finite Impulse Response) filter. But the implementation is vastly different.

Present art DSP (Digital Signal Processing) circuits —many in chip form, such as National Semiconductor Corporation's LM32900—use special architectures that rely on high computational power and processing speeds, multiple buses, extensive internal parallelism and extensive pipelining. They also require considerable resources in the form of RAM memories, FIFO buffers and other peripheral circuits.

The method of this invention is, if anything, more "frugal." It uses far less memory because it needs little or no memory to store raw data and intermediate results. Its analog computer 15 performs high speed arithmetic operations in real time, with a few ordinary components. Most of all, it allows time itself to organize the flow of data. Indeed, each moment in time is represented by an address in sequencer memory 33.

The main disadvantage of using analog component parts as in analog computer 15 is the fact of reduced numerical accuracy. But the time is fast coming when these analog components can be replaced by their digital equivalents, some of which are even now making their first appearance on the market.

The 1000 Hz musical tone example was chosen to illustrate a situation where timing is very critical. This is, of course, not always the case.

In order to complete the discussion on pattern recognition let us next consider a more general case where it is desired to recognize objects by identifying some of their key features in combination.

There will be at least as many locations in organic memory as there are objects, and as many selector addresses as there are sources of data relating to features (i.e., "descriptors"). As has been pointed out previously, the sources of features or descriptors typically are sensors or memories. One organic memory can also be a source of descriptors for itself or another organic memory. Indeed, there is no theoretical limit to the number of sensor or memory groups that can be so "layered."

Each location in memory 6 is the "place" or one of the "places" where a user (like CPU 21) will be looking for evidence of an object or condition, state, situation, etc.

The program of the sequencer is written in such a way that all sources of descriptors are scanned and connected to the places in memory 6 that represent objects with which the descriptors have a meaning or relationship. Some descriptors are more meaningful than others and a greater weight (W) is assigned to them. The descriptors that negate the likelihood of an object or condition carry a negative weight, thereby diminishing the amount stored in the corresponding object place.

Of course, the success of a recognition task depends critically on having access to relevant and, if possible, unambiguous descriptors.

There are also hierarchies among descriptors. For instance, on the most "primitive" level one might have simple "stimuli" such as light intensity, color, or orientation. The second intermediate level might include more advanced descriptors such as shape and size. A third level might feature such complex descriptors as the names of whole objects, etc.

Thus far the discussion has sought to demonstrate how the use of this invention's methods for pattern recognition results in additional levels or layers of descriptors with progressively increased meaning. The occurrence of separate and distinct levels of descriptors contributes to the meaning of the word "intelligence" as applied to machines. Indeed, the representational potential of data is at least as important as memory size and processing speed.

A novel aspect of this invention is that it includes the ability to "forget" data with the passage of time. By this expedient the machine restricts itself preferentially to information that is more immediately relevant. The process is entirely automatic. It liberates obsolete memory and has the effect of resolving conflicts by taking into account the chronology of the events that led to them.

In effect, the machine can "change its mind", a fact that in itself serves intelligence well because it contributes to survivability in unpredictable situations.

While the invention has been described with reference to its presently preferred embodiment, its scope is not limited thereto. Rather, the scope of this invention is as defined in the following set of claims and all equivalents and is not otherwise limited.

I claim

1. An Organic-Like Memory, where items of information are enhanced or degraded with each new access, including, but not limited to, the following combination of means and connections:

Standard memory means for storing bits of information

Operational amplifier means in a multiplying and summing configuration for multiplying two separate analog input signals, each by its own assigned gain factor, and then adding the resulting products, said multiplying and summing configuration consisting of means as follows connected to the output and inputs of said operational amplifier means:

Feedback resistor means connected between the output and the inverting input of said operational amplifier means First controllably variable resistance means connected to one of the inputs of said operational amplifier means Second controllably variable resistance means connected to one of the inputs of said operational amplifier means Feedback connection linking the output of said standard memory means to the free end of said first controllably variable resistance means including the following means connected in series in its path:

Latch means whose input is connected to output of said standard memory means for storing one item of information read from said standard memory means First digital-to-analog converter means whose input is connected to output of said latch means for converting the digital signal stored in said latch means into its analog voltage representation and whose output is connected to the free end of said first controllably variable resistance means Input connection linking the input of the Organic-Like Memory to the free end of said second controllably variable resistance means including the following means connected in series in its path:

Second digital-to-analog converter means whose input is the input of the Organic-Like Memory for translating an input digital code into a corresponding analog voltage level Sample-and-hold means whose input is tied to output of said second digital-to-analog converter means for holding said second digital-to-analog connverter means' output voltage at a constant level for a period of time and whose output is connected to the free end of said second controllably variable resistance means Common connection linking the output of said operational amplifier means to input of said standard memory means including the following in its path:

Analog-to-digital converter means for converting the analog voltage level present at output of said operational amplifier means into a corresponding digital code Control circuit means for generating the control signals required for the proper operation of said standard memory means, said latch means, said sample-and-hold means, said first controllably variable resistance means, and said second controllably variable resistance means.

2. The Organic-Like Memory of claim 1 in which said second digital-to-analog converter means is omitted so that the input of said Organic-Like Memory is directly connected to the free end of said second controllably variable resistance means whenever the input signal is an analog voltage level.

3. The Organic-Like Memory of claim 2, in which said control circuit means can additionally be accessed via input connections as follows:

Sequence control input for entering sequence and parameter data

Host control input for instructing said control circuit means to read the contents of said standard memory means without modifying them.

4. The Organic-Like Memory of claim 1, in which said control circuit means can additionally be accessed via input connections as follows:

Sequence control input for entering sequence and parameter data

Host control input for instructing said control circuit means to read the contents of said standard memory means without modifying them.

5. The Organic-Like Memory of claim 1 in which said operational amplifier mean in a multiplying and summing configuration and its attendant said feedback resistor and said first and second controllably variable resistance means is replaced by the equivalent digital means for the summing and multiplying of signals read from said standard memory means and from the input to the Organic-Like Memory prior to re-storage in said standard memory means.

* * * * *